United States Patent
Beaujuge et al.

(10) Patent No.: US 10,315,177 B2
(45) Date of Patent: Jun. 11, 2019

(54) OXIDE SHELL STRUCTURES AND METHODS OF MAKING OXIDE SHELL STRUCTURES

(71) Applicant: KING ABDULLAH UNIVERSITY OF SCIENCE AND TECHNOLOGY, Thuwal (SA)

(72) Inventors: Pierre M. Beaujuge, Thuwal (SA); Yangqin Gao, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 93 days.

(21) Appl. No.: 15/517,324

(22) PCT Filed: Oct. 8, 2015

(86) PCT No.: PCT/IB2015/002135
§ 371 (c)(1),
(2) Date: Apr. 6, 2017

(87) PCT Pub. No.: WO2016/055865
PCT Pub. Date: Apr. 14, 2016

(65) Prior Publication Data
US 2017/0296995 A1    Oct. 19, 2017

Related U.S. Application Data

(60) Provisional application No. 62/062,354, filed on Oct. 10, 2014.

(51) Int. Cl.
*B01D 5/00* (2006.01)
*B01J 10/02* (2006.01)
*B01J 37/00* (2006.01)
*B01J 37/03* (2006.01)
*C01B 33/12* (2006.01)
*C23C 16/00* (2006.01)

(52) U.S. Cl.
CPC ............ *B01J 10/02* (2013.01); *B01D 5/0066* (2013.01); *B01J 37/0072* (2013.01); *B01J 37/033* (2013.01); *C01B 33/126* (2013.01); *C23C 16/003* (2013.01); *C01P 2004/32* (2013.01); *C01P 2004/64* (2013.01)

(58) Field of Classification Search
None
See application file for complete search history.

(56) References Cited

U.S. PATENT DOCUMENTS

2013/0215514 A1    8/2013  Kim
2013/0236641 A1*   9/2013  Aizenberg ............ C23C 16/402
                                                                427/255.6

OTHER PUBLICATIONS

International Search Report and Written Opinion of Application No. PCT/IB2015/002135 dated Feb. 15, 2016, 12 pages.
(Continued)

*Primary Examiner* — Anthony J Zimmer
(74) *Attorney, Agent, or Firm* — Billion & Armitage; Benjamin C. Armitage

(57) ABSTRACT

Embodiments of the present disclosure provide for substrates having an oxide shell layer (e.g., a silica shell layer), methods of making an oxide shell layer, and the like.

13 Claims, 8 Drawing Sheets

(56) References Cited

OTHER PUBLICATIONS

Shabnam Dadgostar et al: "Mesoporous Submicrometer TiO 2 Hollow Spheres As Scatterers in Dye-Sensitized Solar Cells", ACS Applied Materials and Interfaces, vol. 4, No. 6, Jun. 27, 2012, pp. 2964-2968, XP055247497.
Yabu H et al: "Simple Fabrication of Micro Lens Arrays", Jan. 1, 2005, Langmuir, pp. 1709-1711, XP002550479.
Gun-Young Jung et al: "Vapor-Phase Self-Assembled Monolayer for Improved Mold Release in Nanoimprint Lithography", Langmuir, vol. 21, No. 4, Feb. 1, 2005, pp. 1158-1161, XP055247633.
Yangqin Gao: "Arrays of Hollow Silica Half-Nanospheres via the Breath Figure Approach—Gao—2015—Advanced Materials Interfaces—Wiley Online Library", Apr. 21, 2015, XP055248292.
Banga, et al., "FTIR and AFM Studios of the Kinetics and Self-Assembly of Alkyltrichlorosilanes and (Perfluoroalkyl) trichlorosilanes onto Glass and Silicon", Langmuir, 1995, 4393-4399.
Beysens, et al., "Growth of Breath Figures", Jul. 14, 1986, 1433-1436.
Boker, et al., "Hierarchical nanoparticle assemblies formed by decorating breath figures", May 2004, 302-306.
Brown, et al., "Superhydrophobic Hierarchical Honeycomb Surfaces", Langmuir, 2012, 13712-13719.
Bunker, "The Impact of Solution Agglomeration on the Deposition of Self-Assembled Monolayers", Langmuir, 2000, 7742-7751.
Connal, et al., "Preparation of Porous Poly(dimethylsiloxane)-Based Honeycomb Materials with Hierarchal Surface Features and Their Use as Soft- Lithography Templates", Inter Science, 2006, 3024-3028.
Dadgostar, et al., "Mesoporous Submicrometer TiO2 Hollow Spheres As Scatterers in Dye-Sensitized Solar Cells", Applied Material & Interfaces, 2012, 2964-2968.
Deng, et al., "Transparent, Thermally Stable and Mechanically Robust Superhydrophobic Surfaces Made from Porous Silica Capsules", Advanced Materials, 2011, 2962-2965.
Fritter, et al., "Experiments and simulation of the growth of droplets on a surface (breath figures)", Physical Review A, Mar. 15, 1991, 2858-2869.
Galeotti, et al., "Precise surface patterning of silk fibroin films by breath figures", This journal is the Royal Society of Chemistry, 2012, 4815-4821.
Grange, et al., "Effects of Surface Hydration on the Deposition of Silane Monolayers on Silica", Langmuir, 1993, 1749-1753.
Gun-Young, et al., "Vapor-Phase Self-Assembled Monolayer for Improved Mold Release in Nanoimprint Lithography", Langmuir, 2005, 1158-1161.
Hartmut, et al., "Ripening of Ordered Breath Figures", Physical Review Letters, 2000, 4156-4159.
Heiko, et al., "Breath Figures as a Dynamic Templating Method for Polymers and Nanomaterials", Advanced Materials, 2006, 973-989.
Hernandez-Guerrero, et al., "Honeycomb structured polymer films via breath figures", Polymer Chemistry, 2011, 563-577.
Hexing, et al., "Mesoporous Titania Spheres with Tunable Chamber Stucture and Enhanced Photocatalytic Activity", JACS Communications, 2007, 8406-8407.
Hiroshi, et al., "Simple Fabrication of Micro Lens Arrays", 2005, 1709-1711.
Hiroshi, et al., "Single-Step Fabrication of Transparent Superhydrophobic Porous Polymer Films", 2005, 5231-5234.
Hiroshi, et al., "Superhydrophobic and Lipophobic Properties of Self-Organized Honeycomb and Pincushion Structures", Langmuir, 2005, 3235-3237.
Hozumi, et al., "Fluoroalkylsilane Monolayers Formed by Chemical Vapor Surface Modification on Hydroxylated Oxide Surfaces", Langmuir, 1999, 7600-7604.
Hua, et al., "Breath Figure Arrays: Unconventional Fabrications, Functionalizations, and Applications", Angewandte Minireviews, 2013, 12240-12255.
Hyung-Jun, et al., "Nano-embossed Hollow Spherical TiO2 as Bifunctional Material for High-Efficiency Dye Sensitized Solar Cells", Advanced Materials, 2008, 195-199.
Kabuto, et al., "Thermally Stable and Solvent Resistant Mesoporous Honeycomb Films from a Crosslinkable Polymer", Advanced Functional Materials, 2007, 3569-3573.
Kenichi, et al., "Preparation of Patterned Zinc Oxide Films by Breath Figure Templating", Langmuir Article, 2010, 12173-12176.
Ling-Shu, et al., "Ordered Microporous Membranes Templated by Breath Figures for Size-Selective Separation", Journal of the American Chemical Society, 2012, 95-98.
Midawski, et al., "Self-organized honeycomb morphology of star-polymer polystyrene films", Nature, Jun. 2, 1994, 387-389.
Park, et al., "Hierarchically Ordered Polymer Films by Templated Organization of Aqueous Droplets", Advanced Functional Materials, 2007, 2315-2320.
Rykaczewski, et al., "Direct Imaging of Complex Nano—to Microscale Interfaces Involving Solid, Liquid, and Gas Phases", ACS Nano, 2012, 9326-9334.
Rykaczewski, et al., "Dynamics of Nanoparticle Self-Assembly into Superhydrophobic Liquid Marbles during Water Condensation", ACS Nano, 2011, 9746-9754.
Rykaczewski, et al., "How nanorough is rough enough to make a surface superhydrophobic during water condensation?", Soft Matter, 2012, 8786-8794.
Stenzel, et al., "Formation of Honeycomb-Structured, Porous Films via Breath Figures with Different Polymer Architectures", 2006, 2363-2375.
Thorsten, et al., "An AFM study of the growth kinetics of the self-assembled octadecylsiloxane monolayer on oxidized silicon", 2003, 963-969.
Xiaofeng, et al., "A Bottom-Up Approach to Fabricate Patterned Surfaces with Asymmetrical TiO2 Microparticles Trapped in the Holes of Honeycomblike Polymer Film", Journal of the American Chemical Society, 2011, 3736-3739.
Yingdan, et al., "Honeycomb-Structured Films by Multifunctional Amphiphilic Biodegradable Copolymers: Surface Morphology Control and Biomedical Application as Scaffolds for Cell Growth", Applied Material & Interfaces, 2011, 2487-2495.

* cited by examiner

Fig. 6A
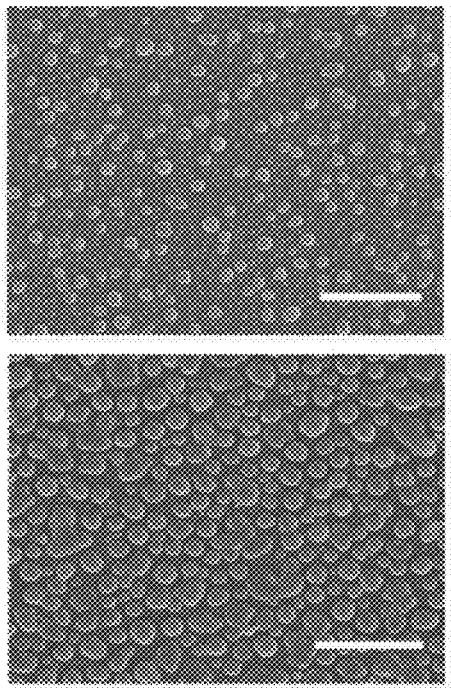
Fig. 6B
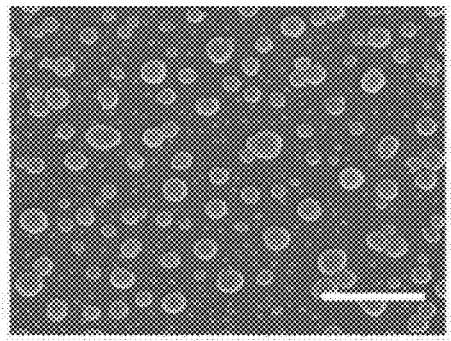
Fig. 6C
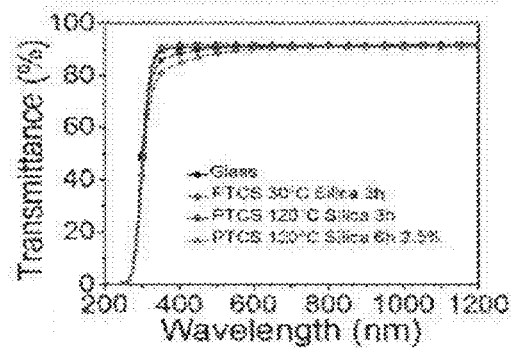
Fig. 6D
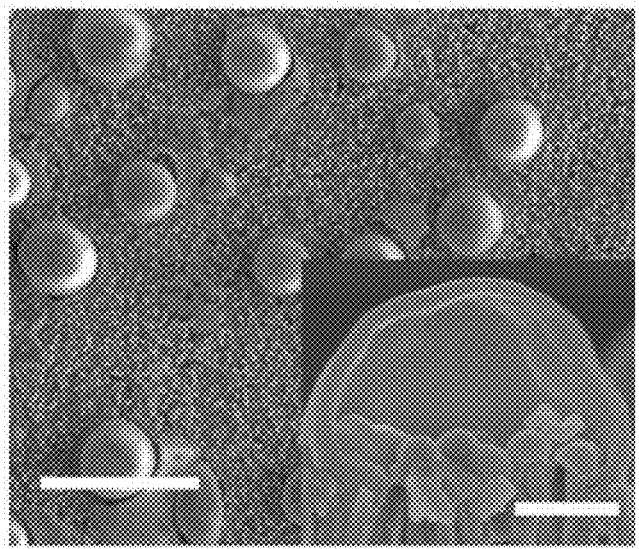
Fig. 7

OXIDE SHELL STRUCTURES AND METHODS OF MAKING OXIDE SHELL STRUCTURES

CROSS-REFERENCE TO RELATED APPLICATIONS

This application is the National Stage of International Application No. PCT/IB2015/002135, filed 8 Oct. 2015, which claims the benefit of and priority to U.S. Provisional Patent Application No. 62/062,354 entitled "OXIDE SHELL STRUCTURES AND METHODS OF MAKING OXIDE SHELL STRUCTURES", filed on 10 Oct. 2014, all of which are expressly incorporated by reference as if fully set forth herein in their entirety.

BACKGROUND

A breath figure (BF) is a pattern that results from condensation on a cold surface; for example, the fog formed when a person blows on a cold window is a breath figure. Since BFs are simple (experienced daily), fast (formed instantly), and surface-dependent, bottom-up (nucleation and growth) approaches to generating hundreds and thousands of liquid droplets on the nm and μm scales, BFs have been shown to be used as a templating technique to produce highly ordered and continuous honeycomb-structured films.[1] For the first demonstration, a solution of star-shaped polystyrene was drop-cast under moist air flow, yielding a highly regular hexagonal pattern of water droplets self-assembled on the thin film of polymer solution by simple evaporative cooling. The authors showed that the imprint of water droplets can be replicated by selective precipitation of the polymer at the water/polymer solution interface. As water evaporated, arrays of hexagonally ordered and bowl-shaped or spherical pores—reminiscent of a honeycomb structure—formed throughout the hardened polymer film. Since the pioneering work by FrancOs and coworkers, several reports have described the development of porous honeycomb-structured patterns by the BF approach on various types of materials,[2-9] and a number of important applications have emerged such as the manufacturing of highly ordered nano- and micron-sized templates,[10-12] micro lenses,[13] and superhydrophobic coatings.[14-16]

Despite significant effort to broaden the range of materials and substances that can be used to form porous honeycomb structures via the BF approach in the last decades,[11, 17-18] the lack of new findings in this area has limited pursuits of novel architectures and key applications.

SUMMARY

Embodiments of the present disclosure provide for structures including substrates having an oxide shell layer (e.g., a silica shell layer), methods of making an oxide shell layer, and the like.

In an embodiment, the methods for forming an oxide shell layer include: providing a substrate having a solvophobic surface in a closed chamber under a first set of conditions; exposing the substrate to a set of precursors in the vapor phase; condensing a first precursor of the set of precursors on the substrate to form a plurality of liquid droplets, wherein the first set of conditions are such that the first precursor condenses on a surface of the substrate before other precursors of the set of precursors condense on the substrate; forming a thin oxide shell at an air-liquid interface of one or more of the liquid droplets by reacting the other precursors of the set of precursors at the air-liquid interface of the liquid droplets to form an oxide shell layer; and removing the liquid droplets to produce a substrate having a plurality of oxide shells disposed on the solvophobic surface that form the oxide shell layer.

In an embodiment, the structures include: a substrate having an oxide shell layer by: providing a substrate having a solvophobic surface in a closed chamber under a first set of conditions; exposing the substrate to a set of precursors in vapor phase; condensing a first precursor of the set of precursors on the substrate to form a plurality of liquid droplets, wherein the first set of conditions are such that the first precursor condenses on a surface of the substrate before other precursors of the set of precursors condense on the substrate; forming a thin oxide shell at an air-liquid interface of one or more of the liquid droplets by reacting the other precursors of the set of precursors at the air-liquid interface of the liquid droplets to form an oxide shell layer; and removing the liquid droplets to produce a substrate having a plurality of oxide shells disposed on the solvophobic surface that form the oxide shell layer.

In an embodiment, the structures include: a substrate including an oxide shell layer on the surface of the substrate, wherein the oxide shell layer includes an array of oxide shells. The substrate can have a solvophobic surface.

In any one or more aspects of any one or more of the embodiments the oxide shell layer can be a silica shell layer. The solvophobic surface can be a hydrophobic surface. The hydrophobic surface can be a heterogeneous and hydrophobic surface. The set of precursors in vapor phase can include a water vapor, an ammonia vapor, and a tetraethyl orthosilicate (TEOS) vapor. The set of precursors can include a first precursor that is water, a second precursor that is tetraethyl orthosilicate, and a third precursor that is ammonia. The step of exposing can include exposing the substrate to a first solution and a second solution, wherein the first solution comprises an aqueous ammonium solution and the second solution comprises TEOS, wherein the first solution and the second solution release a water vapor, an ammonia vapor, and a TEOS vapor. The solvophobic substrate can be a hydrophobic substrate with surface heterogeneities which is inherently hydrophobic, or the solvophobic substrate can be a hydrophobic substrate that was treated to have a hydrophobic surface, or include a hydrophobic layer. The hydrophobic substrate can be a perfluorooctyltrichlorosilane (PTCS) coated substrate that includes PTCS aggregate heterogeneities. The steps of condensing and forming can occur concomitantly.

In any one or more aspects, the oxide shell layer can have a diameter of about 50 to 5000 nm, and height at the highest point of about 35 to 3500 nm, wherein the average density of the oxide shell shells can be about 1 to 10 μm$^2$, and wherein the oxide shell layer can have a thickness of about 10 to 80 nm. The oxide shell layer-to-substrate coverage of the substrate can be about 25 to 65%. The oxide shell layer can be modified to have a water contact angle of about 155 to 165° and a rolling off angle of about 8 to 12°. The substrate including the oxide shell layer can have a transmittance of about 80 to 90% at a wavelength of about 350 to 1200 nm. The morphology of the oxide shell layer can be controlled by altering a surface property(s) of the substrate, conditions of deposition of oxide shell layer onto the substrate, time of deposition of the oxide shell layer onto the substrate, or a combination thereof.

Other structures, methods, features, and advantages will be, or become, apparent to one with skill in the art upon examination of the following drawings and detailed description. It is intended that all such additional structures, systems, methods, features, and advantages be included within this description, be within the scope of the present disclosure, and be protected by the accompanying claims.

BRIEF DESCRIPTION OF THE DRAWINGS

FIG. 3D illustrates height histograms associated with PTCS vapor-deposition steps of 30 min and 1 h at 90° C.

FIG. 4D illustrates height histograms associated with PTCS vapor-deposition steps of 1 h at various temperatures ranging from 30° C. to 120° C., in 30° C. steps.

FIGS. 6A-D illustrate SEM images of several arrays of hollow silica half-nanospheres formed on dehydrated and PTCS-modified glass substrates and upon various TEOS hydrolysis conditions: (FIG. 6A) PTCS-modified glass: 1 h PTCS deposition at 30° C. and under ca. 130 Torr/TEOS hydrolysis step: 3 h exposure (room temperature, under ca. 100 Torr) to an atmosphere saturated in water, ammonia (20% w/v ammonium hydroxide solution) and TEOS vapors. Scale bar: 1 µm; (FIG. 6B) PTCS-modified glass: 1 h PTCS deposition at 30° C. and under ca. 130 Torr/TEOS hydrolysis step: 6 h exposure (room temperature, under ca. 100 Torr) to an atmosphere saturated in water, ammonia (diluted ammonium solution: 2.5%) and TEOS vapors. Scale bar: 1 µm; (FIG. 6C) PTCS-modified glass: 1 h PTCS deposition at 120° C. and under ca. 130 Torr/TEOS hydrolysis step: 6 h exposure (room temperature, under ca. 100 Torr) to an atmosphere saturated in water, ammonia (diluted ammonium hydroxide solution: 2.5%) and TEOS vapors. Scale bar: 4 µm; (FIG. 6D) UV-Vis-NIR transmittance spectra of selected PTCS-modified and nanostructured glass substrates.

FIG. 7 illustrates a SEM image of an assembly of hollow silica half-nanospheres formed on a superhydrophobic array of perfluorodecyltriethoxysilane (PTES)-modified ZnO nanorods; Scale bar: 5 µm. Inset: Magnified cross-sectional SEM image of one of the apparent silica "nanodomes", emphasizing the hollow nature of the nanostructures; Scale bar: 500 nm.

(FIG. 8B) fused silica, (FIG. 8C) silicon substrate with ca. 200 nm thermally growth oxidized layer, (FIG. 8D) borosilicate glass substrate; Scale bar (FIGS. 8B-D): 200 nm.

(FIG. 10A) PTCS-modified glass: 1 h PTCS deposition at 60° C. and under ca. 130 Torr/TEOS hydrolysis step: 3 h exposure (room temperature, under ca. 100 Torr) to an atmosphere saturated in water, ammonia (20% w/v ammonium hydroxide solution) and TEOS vapors. Scale bar: 2 µm; (FIG. 10B) PTCS-modified glass: 1 h PTCS deposition at 90° C. and under ca. 130 Torr/TEOS hydrolysis step: 3 h exposure (room temperature, under ca. 100 Torr) to an atmosphere saturated in water, ammonia (20% w/v ammonium hydroxide solution) and TEOS vapors. Scale bar: 4 μm; (FIG. 10C) PTCS-modified glass: 1 h PTCS deposition at 60° C. and under ca. 130 Torr/TEOS hydrolysis step: 6 h exposure (room temperature, under ca. 100 Torr) to an atmosphere saturated in water, ammonia (diluted ammonium hydroxide solution: 2.5%) and TEOS vapors. Scale bar: 2 μm; (FIG. 10D) PTCS-modified glass: 1 h PTCS deposition at 90° C. and under ca. 130 Torr/TEOS hydrolysis step: 6 h exposure (room temperature, under ca. 100 Torr) to an atmosphere saturated in water, ammonia (diluted ammonium hydroxide solution: 2.5%) and TEOS vapors. Scale bar: 4 μm.

DETAILED DESCRIPTION

Figure 1A:
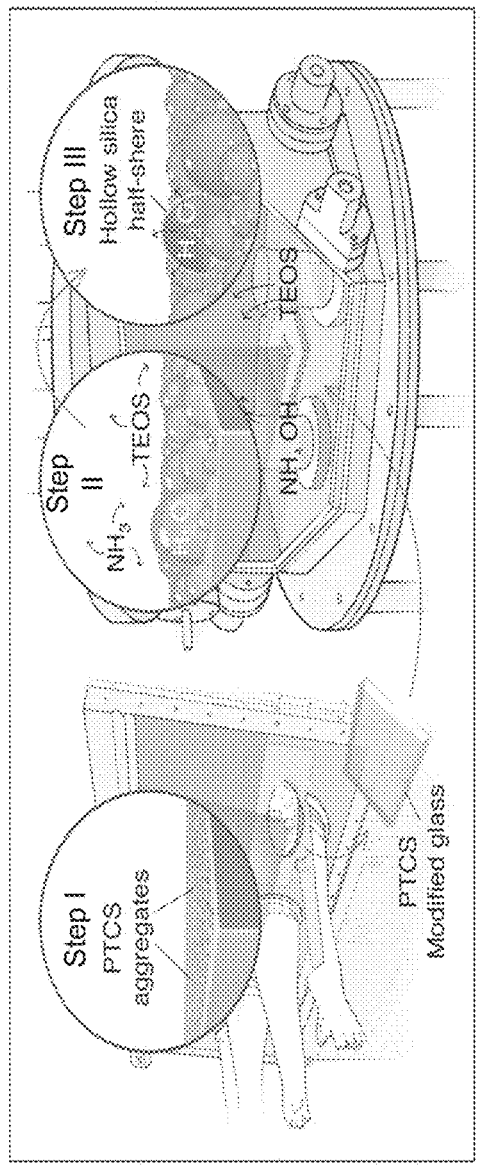
FIG. 1A is a schematic illustration of the stepwise process of forming hollow silica half-nanospheres via the BF approach on PTCS-modified glass substrates (PTCS=perfluorooctyltrichlorosilane, TEOS=tetraethyl orthosilicate).

This disclosure is not limited to particular embodiments described, and as such may, of course, vary. The terminology used herein serves the purpose of describing particular embodiments only, and is not intended to be limiting, since the scope of the present disclosure will be limited only by the appended claims.

Where a range of values is provided, each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method may be carried out in the order of events recited or in any other order that is logically possible.

Embodiments of the present disclosure will employ, unless otherwise indicated, techniques of organic chemistry, biochemistry, microbiology, molecular biology, pharmacology, medicine, and the like, which are within the skill of the art. Such techniques are explained fully in the literature.

Prior to describing the various embodiments, the following definitions are provided and should be used unless otherwise indicated.

Unless otherwise defined, all technical and scientific terms used herein have the same meaning as commonly understood by one of ordinary skill in the art of microbiology, molecular biology, medicinal chemistry, and/or organic chemistry. Although methods and materials similar or equivalent to those described herein can be used in the practice or testing of the present disclosure, suitable methods and materials are described herein.

As used in the specification and the appended claims, the singular forms "a," "an," and "the" may include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Discussion:

Embodiments of the present disclosure provide for substrates having an oxide shell layer (e.g., a silica shell layer), methods of making an oxide shell layer, and the like. Embodiments of the present disclosure provide a simple method to form the oxide shell layer using a breath figure technique.

An embodiment of the present disclosure can include a substrate with the oxide shell layer (e.g., silica oxide shell layer) that has high specific surfaces, low volumetric density values, low refractive indices, and high surface roughness. In this regard, the substrate can find use in a wide range of applications, including: surface coatings and surface engineering, photonics, optoelectronics modules, photovoltaic modules, and light management, micro-lenses, manufacturing of nano- and micron-sized templates, surface/heterogeneous catalysis, and transparent nanostructured coatings (e.g., superhydrophobic, anti-fouling). Additional details are described below and in the Example.

Previously, to generate hollow nanostructures, one used a template-based method. In general, polystyrene, silica nanoparticles, or other solid materials are used as template. After these hard templates are wrapped by the target material, they need to be removed by either high temperature calcination or rinsed by selective corrosive solvents (sacrificial templates). Furthermore, an extra step like spin-coating, dip-coating, etc. generally needs to be taken in order to form the hollow nanostructure on top of the substrates. Also, the breath figure approach has only been used to produce porous honeycomb structures ("negative" templates) on evaporating liquids thus far (note: the temperature gradient at the surface of the evaporating liquid is used to trigger the formation of the breath figure).

In contrast, embodiments of the present disclosure can include methods that use condensed liquid droplets such as water in a breath figure template to produce oxide shell hollow nanostructures such as silica shell hollow nanostructures (half-spheres or nanodomes). Once the oxide shells are formed, the breath figure template (e.g., liquid droplets such as water droplets) can be removed (e.g., using a vacuum). The steps of forming the breath figure and the oxide shell hollow half-nanospheres are concomitant (1-step process): the fluid condenses on the surface to form fluid droplets, and the oxide shell is directly deposited on the fluid droplet surface where it is immobilized by a hydrolysis process. In contrast to other breath figure techniques, embodiments of the present disclosure use the breath figure template (e.g., condensed fluid droplets) to produce a "positive" template composed of arrays of oxide shell hollow half nanospheres, which is a process/method and outcome/product that are unprecedented. In addition, embodiments of the present disclosure can use surface heterogeneities to produce the breath figure (by "nucleation and growth") and to control its dimensions at the nanoscale.

Now having described embodiments of the present disclosure in general, additional details regarding the method and structure formed therefrom are described below and in the Example.

An embodiment of the present disclosure provides methods for forming an oxide shell layer on the substrate. In particular, the method includes providing a substrate having a solvophobic surface (e.g., hydrophobic) in a closed chamber under a first set of conditions. The substrate is then exposed to a set of precursors (e.g., tetraethyl orthosilicate and ammonia) in the vapor phase (e.g., an ammonia vapor, a tetraethyl orthosilicate vapor, and water vapor). A first precursor (e.g., water) is condensed on the substrate to form a plurality of liquid droplets (e.g., water droplets), where the first set of conditions is such that the first precursor condenses on the surface of the substrate before the other precursors (e.g., a second precursor such as tetraethyl orthosilicate) condenses on the substrate. A thin oxide shell (e.g., silica shell) can be formed at the air-liquid interface of one or more of the liquid droplets by reacting the second precursor vapor released from the a second liquid in the presence of a catalysis vapor (e.g., a third precursor such as ammonia) at the air-first liquid interface of the first liquid droplet to form an oxide shell layer. The first liquid droplets can be removed to produce a substrate having a plurality of oxide shells disposed on the solvophobic surface that forms the oxide shell layer (e.g., silica shell layer).

Now having described the method in general, additional details regarding the method and the substrate including the oxide shell layer will be provided. In an embodiment, the substrate inherently has a solvophobic surface, can be treated to have a solvophobic surface, or include a solvophobic layer. In an embodiment, the substrate inherently has a hydrophobic surface, can be treated to have a hydrophobic surface, or include a hydrophobic layer. In an embodiment, the hydrophobicity of the surface can produce a water contact angle of about 90° to 170°, where the water contact angle can be adjusted by modifying the surface roughness of the substrate. In an embodiment, the hydrophobic surface is a heterogeneous and hydrophobic surface. The substrate can be made of glass, ZnO nanorod arrays, or a hydrophobic substrate with surface heterogeneities. In an embodiment, the surface can be treated with alkylsilanes, such as perfluorooctyltrichlorosilane (PTCS), perfluorodecyltriethoxysilane (PTES), or a combination thereof to produce a hydrophobic heterogeneous surface on a glass substrate.

In an embodiment, surface heterogeneities can be induced on the surface of the substrate to control the nucleation and growth as well as the dimensions of the fluid droplets/oxide shells.

The closed chamber can be a chamber where the method can be conducted under the prescribed conditions to produce the desired product. For example, a closed chamber described in the Example can be used. In an embodiment, the first set of conditions can include controlling the temperature from about 25 to 130° C. and controlling the pressure from about 90 to 140 Torr within the closed chamber. In an embodiment, the temperature of the substrate can be about 25 to 130° C. The temperature and/or pressure can be adjusted to alter the average density, size (e.g., diameter, height, shell thickness), and surface coverage, of the water droplets and the silica shells. The temperature and pressure can be controlled using known techniques and systems.

The set of precursors are used to provide the vapor phase of the components that can be used in the breath figure process to form the oxide shells (e.g., form fluid droplets, catalysis for a component to form an oxide layer on the fluid droplet). The method includes a set of precursors, where at least one of the precursors includes a component that is used to form the fluid droplet, at least one of the precursors includes a component used to form the oxide shell, and a least one of the precursors is a catalyst used to from the oxide shell, where a single precursor can include one or two components. In an embodiment, two precursors can be used, where each precursor includes a component (e.g., water) to form the fluid droplet. In an embodiment, the set of precursors can be selected based on the components to be used to form the fluid droplet, oxide shell, and the catalyst used to form the oxide shell, as well as their respective boiling points.

In an embodiment, silica shells are formed. To illustrate, reference to the set of precursors is directed towards those used to form the silica shells. In an alternative embodiment, another set of precursors can be used to form one of the other oxide shells described herein, and the following description in reference to forming silica shells is not limiting the method.

In an embodiment, the method includes exposing the substrate to a water vapor, an ammonia vapor, and a tetraethyl orthosilicate (TEOS) vapor, to form silica shells. In an embodiment, the substrate is exposed to a first solution and a second solution. In an embodiment, the first solution includes an aqueous ammonium solution (e.g., about 2.5% to 30%) and the second solution comprises TEOS. The first set of conditions and the concentration of the first and second solution are designed so that the first solution and the second solution release the water vapor, the ammonia vapor, and the TEOS vapor. As an alternative to TEOS, other compounds such as tetramethyl orthosilicate, tetrapropyl orthosilicate, and silicon tetrachloride can be used to form the silica shell. As an alternative to silica, other precursors can be used to form other types of oxide shells as described herein.

In an embodiment, the first set of conditions, the concentration of the components, the hydrophobic surface, and the like, can be selected or designed so that water vapor condenses on the substrate prior to the TEOS vapor, where the water vapor condensation forms a plurality of water droplets in a controllable manner (e.g., control the average density, dimension, surface coverage, and the like). In an embodiment, the water droplets can have a diameter of about 50 to 5000 nm, where the diameter can be controlled, at least in part, by selection of the heterogeneous surface. In an embodiment, the water droplets can have a height at the highest point of the water droplet of about 35 to 3500 nm, where the height can be controlled, at least in part, by the selection of the heterogeneous surface and water contact angle of the substrate. In an embodiment, the average density of water droplets can be about 1 to 10 µm$^2$. In an embodiment, the water droplet-to-substrate coverage can be about 25 to 65%. It should be noted that fluid droplets other than water droplets can have similar characteristics and dimensions as described herein.

As noted above, the water droplet and the silica shell can be formed at nearly the same time in a single step. In particular, the silica shell is formed at the air-water interface of the droplets by reacting the TEOS in the presence of ammonia at the air-water interface, where the array of silica shells forms the silica shell layer. In an embodiment, the silica shell can be formed over a time frame of about 30 minutes to 3 hours or longer, where the time can be used to control the shell thickness.

In an embodiment, the breath figure template (water droplets) can be removed to form a substrate having a plurality of silica shells disposed on the hydrophobic surface. In an embodiment, the water can be removed using a vacuum system.

In an embodiment, the oxide shell layer includes a plurality of oxide shells. In an embodiment, the oxide shell can include silica, titanium oxide, zirconium oxide, tantalum oxide, or a combination thereof. In an embodiment, the structure has a silica shell layer on the surface of the substrate. In an embodiment, the silica shell layer includes an array of silica shells, where the silica shell has a thickness of about 10 to 80 nm, depending on the deposition time. In an embodiment, the silica shell can have a diameter of about 50 to 5000 nm, depending on the heterogeneous surface. In an embodiment, the silica shell can have a height at the highest point of about 35 to 3500 nm, depending on the surface heterogeneous and water contact angle of the substrate. In an embodiment, the average density of silica shells can be about 1 to 10 μm$^2$. In an embodiment, the oxide shell layer-to-substrate coverage can be about 25 to 65%. It should be noted that oxide shells other than silica shells can have similar characteristics and dimensions as described herein.

In an embodiment, the silica shell layer can be further modified to have a water contact angle of about 155 to 165° and a rolling off angle of about 8 to 12°. In an embodiment where the substrate is glass or another transparent material, the substrate including the silica shell layer can have a transmittance of about 80 to 90% at a wavelength of about 350 to 1200 nm.

In an embodiment, the average density, size (e.g., diameter, height, shell thickness), and surface coverage, can be controlled in a flexible way by altering the surface properties of the substrate (e.g., surface heterogeneous, water contact angle), the deposition conditions (e.g., pressure, temperature, exposure time for specific precursors) and the deposition time. In this regard, the oxide shell layer can be designed as needed for a particular purpose. In this regard, substrates including the silica shell layer can be used in surface coatings and surface engineering, photonics, optoelectronics, photovoltaic, light management, lenses, nano- and micron-sized templates, catalysis, and coatings.

While embodiments of the present disclosure are described in connection with the Examples and the corresponding text and figures, there is no intent to limit the disclosure to the embodiments in these descriptions. On the contrary, the intent is to cover all alternatives, modifications, and equivalents included within the spirit and scope of embodiments of the present disclosure.

EXAMPLES

Example

In an embodiment of the present disclosure, the nanostructured pattern of silica half-spheres is deposited on a glass substrate following a chemical vapor deposition (CVD) protocol performed while the BF is formed (i.e., the two processes are concomitant). During the process, the air/water interface on each water droplet provides a reactive surface for the hydrolysis of the silica precursor, resulting in the formation of a thin shell of silica around the water droplets pertaining to the BF. Upon removal of the condensed water by simple evaporation in vacuo, an array of hollow silica half-nanospheres remains on the substrate. We find that a wide size range of half-nanospheres (100-700 nm) can be formed on glass by controlling the relative rates of water condensation and hydrolysis from silica precursors (a process carried out at room temperature). In parallel, we find that the presence of surface heterogeneities evenly distributed across the substrate is a determining factor in the formation of the BF templates achieved via our approach, whereas in conventional BF-forming approaches, the condensation of water droplets is triggered by the temperature difference at the air/substrate interface induced upon evaporative cooling of a thin film of liquid already on the substrate.[6] The scalability of our process is demonstrated on glass substrates as large as 7.5 cm×3 cm onto which continuous arrays of hollow silica half-nanospheres are produced (the scale is limited only by the dimensions of the CVD chamber). With their high specific surfaces, low volumetric density values, and low refractive indices, hollow nanostructures find use in a wide range of applications, including photonics and optoelectronics,[19-20] surface catalysis,[21] and transparent nanostructured coatings (e.g., superhydrophobic, anti-fouling).[22] We expect that our method of forming arrays of hollow half-nanospheres via the BF approach will be applicable to various other oxides and a broad range of substrates including large-area flexible plastics.

Results and Discussion

Figure 1C:
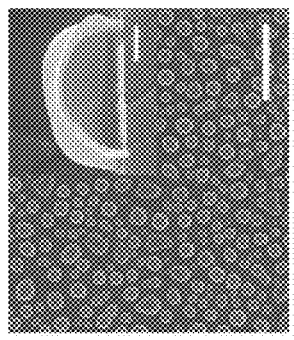
FIG. 1C is a SEM image of an "as-cast" PTCS-modified glass (presence of PTCS aggregates) after exposure to the same TEOS precursor under the same conditions: arrays of silica "nanodomes" can be observed across the substrate. Scale bar: 5 µm. Inset: Magnified cross-sectional SEM image of one of the silica "nanodomes", emphasizing the hollow nature of the nanostructures; Scale bar: 500 nm.
Figure 1B:
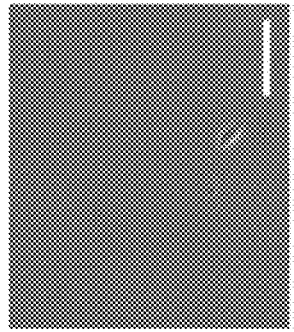
FIG. 1B is a SEM image of a PTCS-modified glass substrate subsequently subjected to a post-deposition cleaning process, before exposure to an atmosphere saturated with water, ammonia (from a 20% w/v ammonium hydroxide aqueous solution) and TEOS vapors (3 h, room temperature, under ca. 100 Torr): the substrate is not amenable to the development of nanostructured patterns via the BF approach. Scale bar: 2 µm.
Figure 2A:
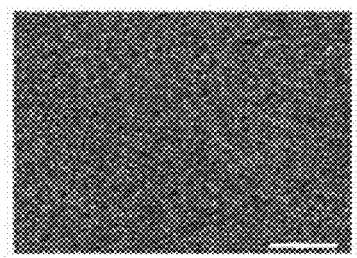
FIGS. 2A-E illustrate AFM images (1*1 µm) of (FIG. 2A) PTCS-modified glass after extended sonication in ethanol (1 h), (FIG. 2B) "as-cast" PTCS-modified glass composed of a continuous and dense pattern of PTCS aggregates (pattern obtained after 1 h of vapor deposition of PTCS at 90° C. under a pressure of ca. 130 Torr), (FIG. 2C) "as-cast" PTCS-modified glass with aggregates formed on a hydrated glass substrate, (FIG. 2D) "as-cast" PTCS-modified glass with aggregates formed on a dehydrated glass substrate, and (FIG. 2E) three-dimensional AFM image (1*1 µm) of the "as-cast" PTCS-modified glass with aggregates formed on a dehydrated glass substrate. Scale bar (FIGS. 1A-D): 200 nm.

The protocol established to form arrays of hollow silica half-nanospheres via the BF approach involves three steps (FIG. 1A). First, the surface of the glass substrate is modified and made hydrophobic by depositing a thin layer of perfluorooctyltrichlorosilane (PTCS) under reduced pressure—this step is aimed at facilitating the formation of the BF (FIG. 1A, step 1).[23] Second, the PTCS-coated glass substrate is placed into a deposition chamber with separate ammonium and tetraethyl orthosilicate (TEOS) sources, and the setup is evacuated (FIG. 1A, step 2). In this closed chamber under reduced pressure, the aqueous ammonium and TEOS solutions release water, ammonia and TEOS vapors. Compared with TEOS (boiling point: 166° C., molecular weight: 208.33 g/mol), water has a lower boiling point, and high water vapor pressures can be reached rapidly in the closed chamber. As a result, water condenses on the PTCS-modified glass substrate before the TEOS counterpart. In the presence of ammonia vapors, the TEOS precursor then undergoes hydrolysis at the air/water interface. As shown in FIGS. 1B and 1C, the outcome of this in-situ hydrolysis step depends on the morphology of the deposited PTCS film: while PTCS-modified glass subsequently subjected to a post-deposition cleaning process shows low RMS (root mean square) roughness values characteristic of a smooth surface (FIG. 2A; RMS=1.73 nm) and is not amenable to the development of nanostructured patterns via the BF approach (FIG. 1B), the "as-cast" PTCS-modified glass shows the presence of PTCS aggregates evenly distributed across the substrate (FIG. 2B; RMS=4.33 nm) and can yield arrays of water droplets enfolded in thin shells of silica (FIG. 1C). Here, we note that, as predicted by nucleation theory, water condensation does not occur on perfectly smooth surfaces unless the temperature difference between the vapor and the solid surface reaches ca. 25 K.[23] In the last step, the deposition chamber is set to a higher vacuum and the water template (BF) is stripped, yielding a dense array of hollow silica half-nanospheres on the PTCS-modified glass substrate (FIG. 1A, step 3).

Figure 2B:
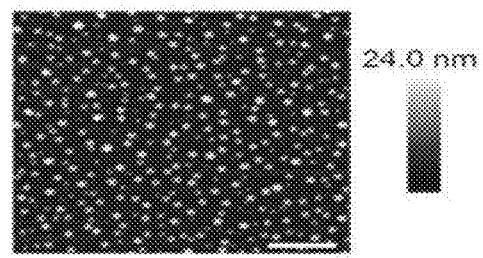
Figure 8A:
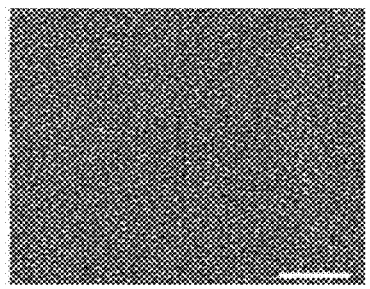
FIG. 8A illustrates a AFM image (3*3 µm) of "as-cast" PTCS-modified glass composed of a continuous and dense pattern of PTCS aggregates formed on a dehydrated glass substrate (pattern obtained after 1 h of vapor deposition of PTCS at 90° C. under a pressure of ca. 130 Torr); Scale bar: 600 nm.
Figure 8B:
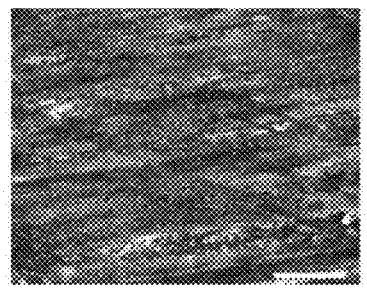
FIGS. 8B-D illustrate AFM images (1*1 µm) of various PTCS-modified substrates (patterns obtained after 1 h of vapor deposition of PTCS at 90° C. under a pressure of ca. 130 Torr)
Figure 8C:
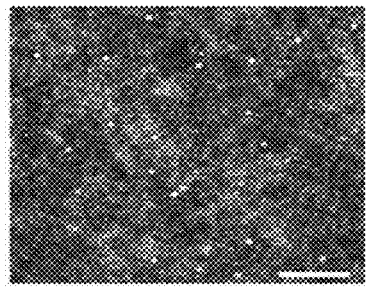
Figure 8D:
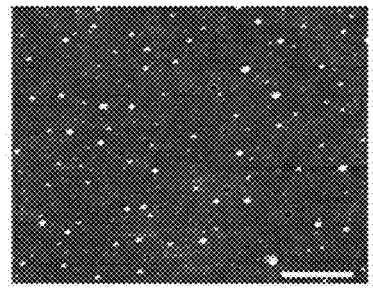

As stated in previous studies,[24-27] the PTCS aggregates shown in FIG. 2B to be evenly distributed across the glass substrate may result from the self-polymerization of PTCS monomers induced during the vapor-deposition of the precursor, and they may only be physisorbed on the surface of the substrate. The vapor deposition of PTCS was performed under inert atmosphere ($N_2$) inside a glovebox ($H_2O$<0.1 ppm) in order to exclude the possibility that moisture would affect the process. Under these conditions, well-dispersed PTCS aggregates were formed on the surface after 1 h of deposition at 90° C. under reduced pressure (ca. 130 Torr) (FIG. 2B). Although a variety of organosilanes have been reported to form spherical aggregates on various surfaces,[24-27] none of the reported precursors has been found to develop the aggregate assemblies with the narrow size-distribution depicted in FIG. 2B (31.4±5.46 nm). Such regularity in size and coverage may be the result of the specific set of experimental conditions used, but could also stem from the nature and surface composition of the substrate itself as organosilane precursors are known to bind to surfaces via hydroxyl groups. In contrast to most of the reported work in which silicon substrates with a native oxidized layer are used,[28-29] our first set of experiments was performed on soda lime glass. In order to probe the effects of surface type and composition on the deposition of PTCS from the vapor phase, PTCS was deposited on several substrates—fused silica, silicon substrate with a thermally oxidized layer, borosilicate glass, and soda lime glass—following a 1 h vapor-deposition step at 90° C. (parallel depositions in the same chamber), and the resulting morphologies were systematically examined by atomic force microscopy (AFM). Different morphologies (i.e., aggregate distributions and sizes) were found on different substrates, including a smooth surface on fused silica (FIG. 8B), well-dispersed aggregates (ca. 27/$\mu m^2$) with average heights of ca. 5 nm on the silicon substrate (FIG. 8C), more densely distributed aggregates (ca. 87/$\mu m^2$) with average heights of ca. 7 nm on borosilicate glass (FIG. 8D), and even higher densities of aggregates (ca. 290/$\mu m^2$) with average heights of ca. 15 nm on soda lime glass (FIG. 2B). Overall, these results show that the morphologies resulting from the deposition of PTCS from the vapor phase are surface dependent. It is also worth noting that the smooth morphology obtained on fused silica contrasts with the patterns of aggregates of different sizes formed on the different types of substrates, and that these empirical observations point to a "nucleation-and-growth" mechanism sensitive to the substrate surface, ruling out the assumption of physisorbed aggregates formed in the vapor phase. We also noted that the same PCTS aggregates can form at the back of the substrates—a surface area that is not readily accessible to PCTS aggregates that would form from the vapor phase. This parallel observation further suggests that the PTCS aggregates are more likely to form directly on the vapor/glass surface.

Figure 2C:
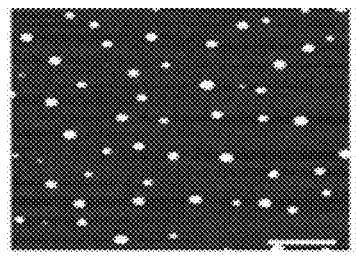
Figure 2D:
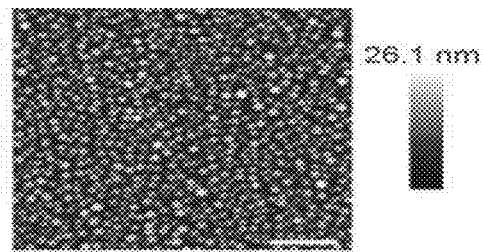
Figure 2E:
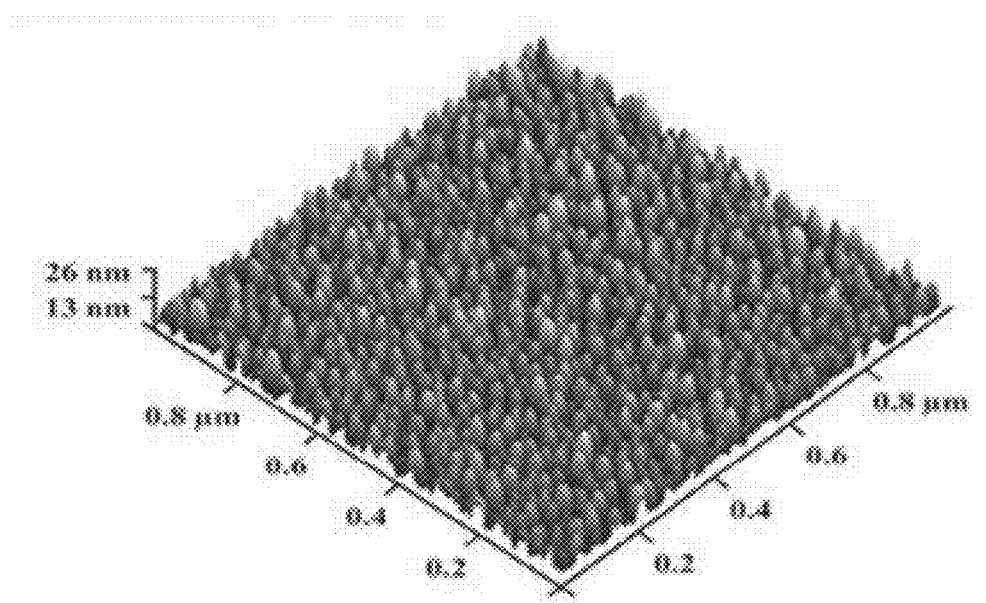

The effect of surface hydroxyl groups was probed by first examining a soda lime glass substrate hydrated by heating the substrate in deionized water at 85° C. for 24 h and second a soda lime glass substrate dehydrated at 500° C. for 3 h.[28-29] PTCS aggregates formed upon a 1 h vapor-deposition step at 90° C. on the hydrated and dehydrated substrates (parallel depositions in the same chamber) showed very distinct distribution patterns, as illustrated in FIGS. 2C and 2D. The hydrated substrate led to the development of well-dispersed aggregates (ca. 59/$\mu m^2$) (FIG. 2C) with average heights of ca. 15 nm, while the dehydrated one promoted the formation of densely distributed aggregates (ca. 798/$\mu m^2$) with comparable average heights of ca. 15 nm (FIG. 2D). It is also worth noting that the hydrated glass that was subsequently dehydrated also led to the formation of densely distributed aggregates, and vice versa. While the interplay between surface hydroxyl groups and the development of PTCS aggregates may be explained in terms of surface energy and remains a matter of discussion, these results clearly emphasize the requirement for a thorough surface treatment (i.e., hydration or dehydration) before the PTCS vapor-deposition step in order to yield reproducible patterns of PTCS aggregates on glass substrates. The uniformity of the resulting assemblies of PTCS aggregates on dehydrated glass is emphasized in FIGS. 2E and 8A (AFM image, 3*3 µm). In light of these empirical observations, and considering the net propensity of thermally annealed substrates to promote the development of densely-distributed PTCS aggregates, we used dehydrated glass in all following experiments, unless otherwise mentioned.

Figure 3A:
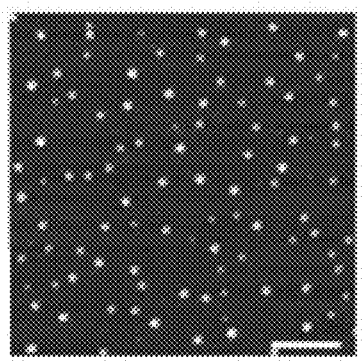
FIGS. 3A-D illustrate AFM images (1*1 µm) of distinct patterns of PTCS aggregates obtained on a dehydrated glass substrate after (FIG. 3A) 5 min, (FIG. 3B) 10 min, or (FIG. 3C) 30 min of vapor deposition of PTCS at 90° C. under a reduced pressure of ca. 130 Torr. Scale bar (FIGS. 3A-C): 200 nm.
Figure 3B:
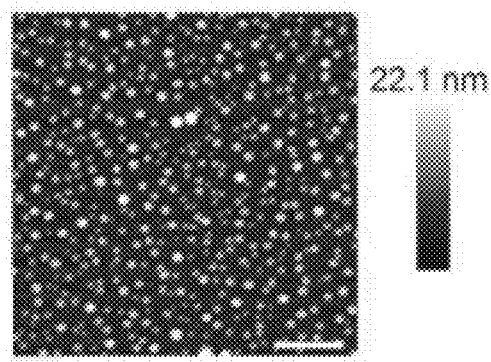
Figure 3C:
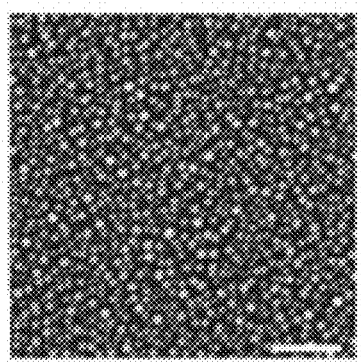
Figure 3D:
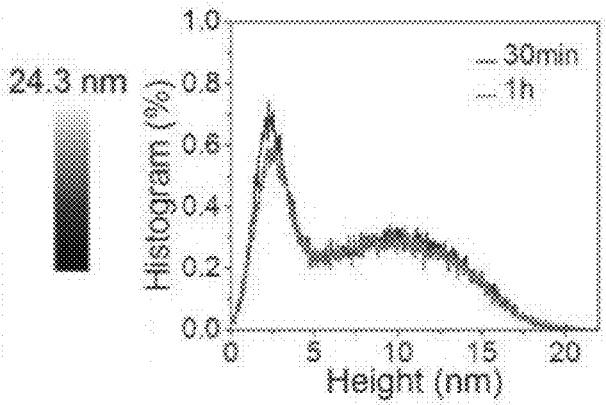

The growth process of PTCS aggregates on glass was inspected by systematic AFM imaging of the patterns produced by vapor deposition steps of 5 min (FIG. 3A), 10 min (FIG. 3B), 30 min (FIG. 3C), and 1 h (FIG. 2D) on several substrates placed in the deposition chamber (sequential depositions) at 90° C. under reduced pressure (ca. 130 Torr). FIGS. 3A-D depict the rapid kinetics of aggregate formation, with aggregate densities of ca. 107/$\mu m^2$ achieved after only 5 min of PTCS deposition from the vapor phase. The density of aggregates then increased by a factor of 5 in the following 5 min to reach aggregate densities of ca. 494/$\mu m^2$ after 10 min of PTCS deposition. Higher aggregate densities of ca. 754/$\mu m^2$ could be reached after 30 min, leveling off at ca. 798/$\mu m^2$ after 1 h of PTCS deposition. Surprisingly, the aggregate size did not change significantly as a function of deposition time, and the particle size distributions remained relatively narrow and comparable between substrates: 23.3±6.6 nm after 5 min, 23.0±7.2 nm after 10 min, 21.8±8.3 nm after 30 min, and 22.6±9.7 nm after 1 h. These results suggest that both kinetic and thermodynamic considerations factor in the formation of PTCS aggregates, and may rapidly limit the size of the developing aggregates via two competing actions: 1) the frequency of attachment of the organosilane precursor at the specific conditions of temperature, pressure and precursor concentration in the vapor phase set during the deposition step, and 2) the formation of new stable aggregates (dependent on the surface free energy). FIG. 3D shows the height histograms of the PTCS aggregate patterns obtained after the 30 min and 1 h deposition steps and account for the aggregate size distributions across the substrates (expressed in % of the total number of heterogeneities scanned by the AFM tip) as a function of the aggregate height profile. With the radius of the AFM tip in the size range of the scanned aggregates, height analyses provide a more accurate description of the size distribution of the patterns compared with width analyses. Here, both height histograms include a sharp distribution of small-sized features (<5 nm on avg.) associated with the glass roughness and a broader distribution of larger features (>5 nm on avg.) pertaining to the PTCS aggregate patterns. These two histograms are very comparable, indicating equivalent pattern compositions: relative densities of aggregates per size, size distribution and relative aggregate-to-glass coverage (inferred from the relative ratio of the two main peaks in each histogram) and in turn indicating that a critical density value of PCTS aggregates is achieved in 30 min.

Figure 4A:
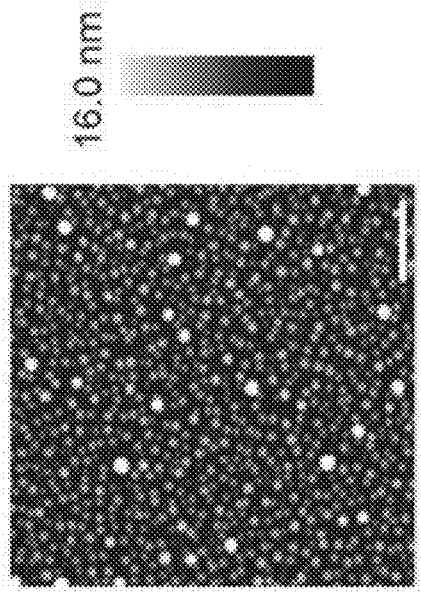
FIGS. 4A-D illustrate AFM images (1*1 µm) of distinct patterns of PTCS aggregates obtained on a dehydrated glass substrate after 1 h of vapor deposition of PTCS at (FIG. 4A) 30° C., (FIG. 4B) 60° C., and (FIG. 4C) 120° C. under a reduced pressure of ca. 130 Torr. Scale bar (FIGS. 4A-C): 200 nm.
Figure 4B:
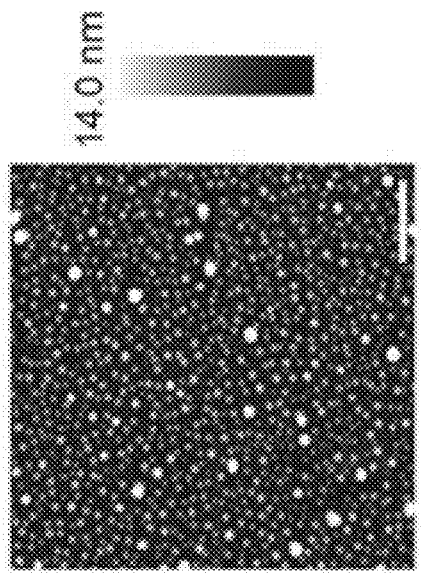
Figure 4D:
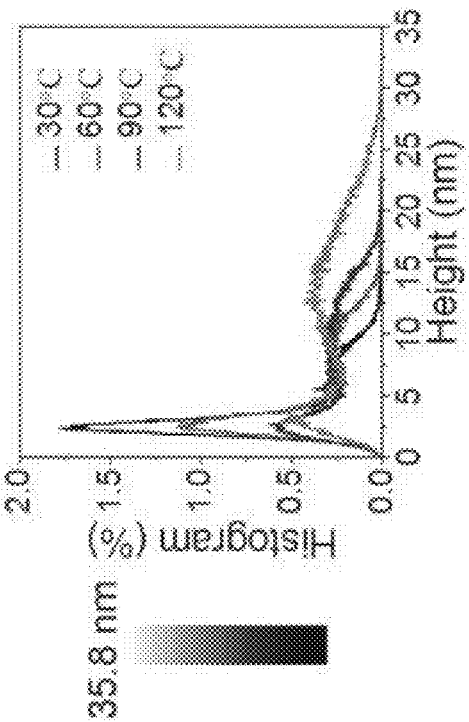
Figure 4C:
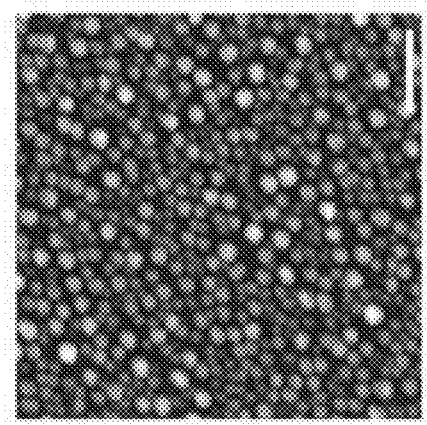

The dependence of temperature on the growth of PTCS aggregates on glass was also examined by systematic AFM imaging of the patterns produced by vapor deposition steps of 1 h on several substrates (sequential depositions) at 30° C. (FIG. 4A), 60° C. (FIG. 4B), and 120° C. (FIG. 4C) under reduced pressure (ca. 130 Torr). As illustrated in FIGS. 4A-D, the vapor deposition of PTCS at lower temperatures—30° C. and 60° C.—yields patterns of smaller-sized aggregates with average heights of ca. 5 nm and ca. 7 nm, respectively, and narrower aggregate size distributions (16.4±5.7 nm and 19.2±7.0 nm, respectively), compared with the large-sized aggregates with average heights of ca. 18 nm and broader size distributions (28.2±12.6 nm) obtained at 120° C. The corresponding aggregate densities achieved after the 1 h PTCS deposition step are ca. 1026/$\mu m^2$ at 30° C., ca. 815/$\mu m^2$ at 60° C., and ca. 473/$\mu m^2$ at 120° C. The net increase in the average aggregate size and related decrease in aggregate densities across the glass with increasing temperature can be linked to the higher surface diffusion rates of the organosilane precursor expected at higher temperature. FIG. 4D shows the height histograms of the PTCS aggregate patterns obtained upon 1 h deposition steps at 30° C., 60° C., 90° C. and 120° C. and emphasizes the significant shift in the average aggregate size towards larger size values with increasing deposition temperature. The histogram also shows the corresponding increase in relative aggregate-to-glass coverage (inferred from the relative ratio of the two main peaks in each histogram).

Figure 5A:
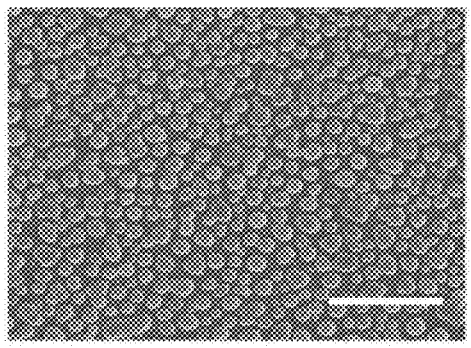
FIG. 5A illustrates a SEM image of an array of hollow silica half-nanospheres formed on a dehydrated and PTCS-modified glass substrate (deposited at 120° C. for 1 h, under ca. 130 Torr) upon 3 h exposure (room temperature, under ca. 100 Torr) to an atmosphere saturated in water, ammonia (from a 20% w/v ammonium hydroxide aqueous solution) and TEOS vapors, resulting in the hydrolysis of the TEOS precursor and in the formation of a thin shell of silica ($SiO_2$) around individual water droplets. Scale bar: 4 µm.
Figure 5B:
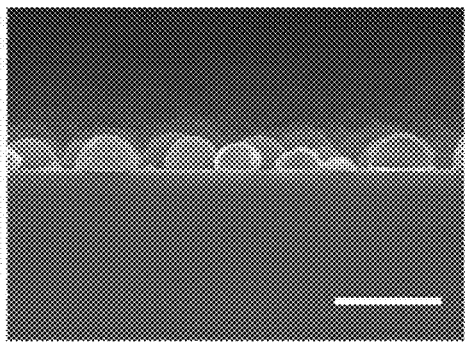
FIG. 5B illustrates cross-sectional SEM image of the same array of hollow silica half-nanospheres. Scale bar: 1 µm.
Figure 5C:
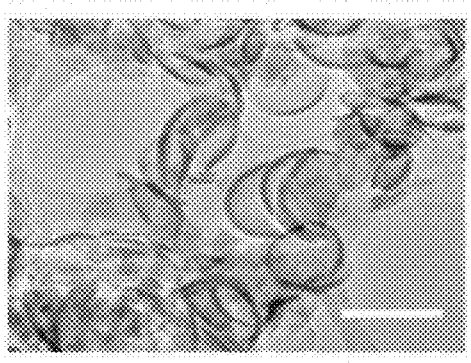
FIG. 5C illustrates TEM image of the hollow silica half-nanospheres lifted off of the PTCS-modified glass substrate. Scale bar: 600 nm.
Figure 5D:
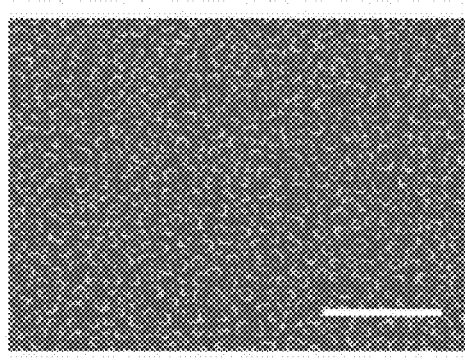
FIG. 5D illustrates a SEM image of an array of hollow silica half-nanospheres formed on PTCS-modified glass substrate prepared following the same protocol as described in (FIG. 5A) and subjected to TEOS hydrolysis for only 1 h (20% w/v ammonium hydroxide solution, room temperature, under ca. 100 Torr). Scale bar: 4 µm.
Figure 9:
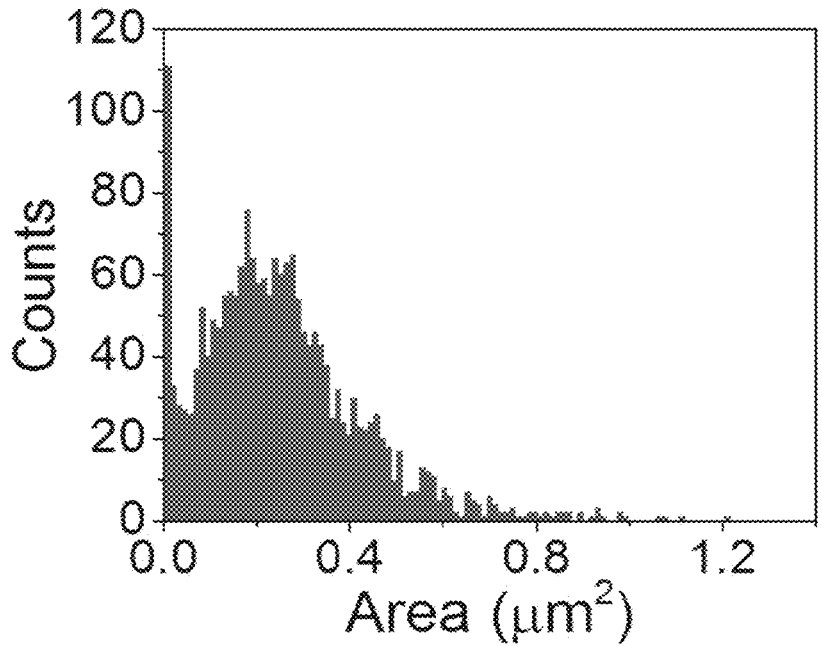
FIG. 9 illustrates an area distribution map of silica half-nanospheres formed on a dehydrated and PTCS-modified glass substrate (deposited at 120° C. for 1 h, under ca. 130 Torr) upon a 3 h exposure (room temperature, under ca. 100 Torr) to an atmosphere saturated in water, ammonia (from a 20% w/v ammonium hydroxide aqueous solution) and TEOS vapors.

As illustrated in FIG. 1A, following the surface modification step via vapor deposition of PTCS, the glass substrate is placed into a second deposition chamber along with an aqueous solution of ammonium hydroxide (20% w/v, source of ammonia) and the tetraethyl orthosilicate (TEOS) precursor. The pressure in the chamber is then reduced (ca. 100 Torr). In the presence of PTCS aggregates distributed across the glass surface and acting as "nucleation" sites, water droplets can easily condense and form a BF on the glass in spite of the absence of a temperature difference at the air/substrate interface. Upon exposure to the moist atmosphere saturated in water, ammonia and TEOS vapors for 1 h, the PTCS-modified glass substrate goes from initially transparent to translucent, indicating that water droplets have formed on the substrate—a process expected to be accompanied by hydrolysis of the TEOS precursor in the presence of ammonia at the air/water interface along with formation of a thin shell of silica ($SiO_2$) around individual water droplets. In the following few hours (1-6 h), the pressure within the chamber is reduced back to its initially set value (ca. 100 Torr) to remove the vapor contents from the chamber, and the translucent glass substrates become transparent again, suggesting that the water droplet volumes are also removed. As shown in FIG. 5A, SEM imaging of the corresponding substrates (initially modified via PTCS deposition at 120° C. for 1 h under ca. 130 Torr) shows arrays of randomly distributed silica "nanodomes". FIG. 5B shows the SEM cross-section of the arrays and indicates that the silica "nanodomes" formed on PTCS-modified glass are hollow, as would be expected upon removing the water droplet volumes during the chamber evacuation step. Such arrays are referred to as "arrays of hollow silica half-nanospheres" in all following experiments. FIG. 5C shows several half-nanospheres lifted off the PTCS-modified glass and imaged by transmission electron microscopy (TEM), indicating that the nanostructures possess a uniformly thin silica shell of ca. 30 nm thickness. FIG. 5D depicts an array of partially collapsed silica half-nanospheres obtained upon a short hydrolysis step of only 1 h and emphasizes the requirement for longer TEOS deposition steps in order to form nanostructures that are sufficiently thick to maintain their integrity during the chamber evacuation process. The particle analysis (FIG. 9) associated with FIG. 5A shows a relatively broad particle size distribution with a mean surface area of ca. 0.259 $\mu m^2$ and a relative particle-to-glass coverage of ca. 57%. Earlier work on the temperature gradient-induced BF process[30] (as opposed to the PTCS aggregate-promoted approach discussed throughout our study) has shown that the relative particle-to-glass coverage of condensing water droplets on glass gradually increases in the early stages and levels off at ca. 57% after tens of seconds (scaling stage). This coverage estimate in the scaling regime (where the pattern characteristics, including particle size distributions and surface coverage, become independent of particle size), originally reported for water droplets of tens of microns,[30] is consistent with the relative particle-to-glass coverage inferred from the particle analysis pertaining to the array of half-nanospheres shown in FIG. 5A, albeit with water droplet-templated feature sizes on the order of only 500 nm. In our experimental protocol, the high particle-to-glass coverage achieved with sub-micron sized water droplet templates could be the result of the PTCS aggregate-promoted BF approach used to develop and rapidly immobilize the pattern of water droplets formed on the glass substrate. We also note that, among all of the techniques known to date for the study of water condensation processes,[31-34] our experimental protocol provides a powerful tool for ex-situ analyses of water condensation in the very early stages.

Figure 10A:
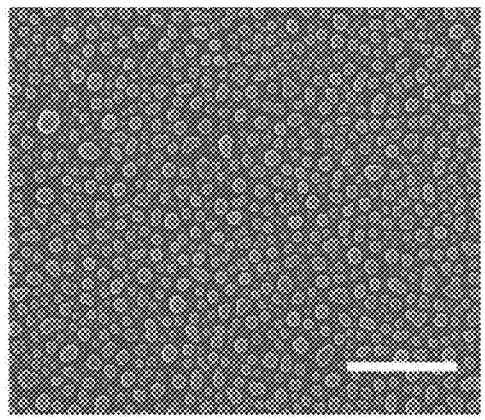
FIGS. 10A-D illustrate SEM images of several arrays of hollow silica half-nanospheres formed on dehydrated and PTCS-modified glass substrates and upon various TEOS hydrolysis conditions.
Figure 10B:
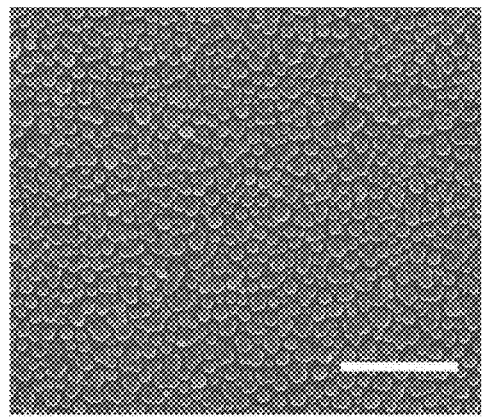
Figure 10C:
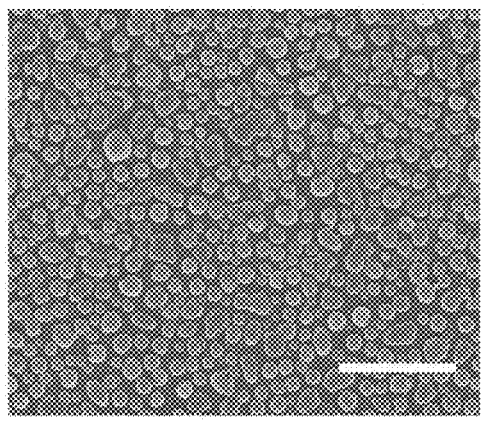
Figure 10D:
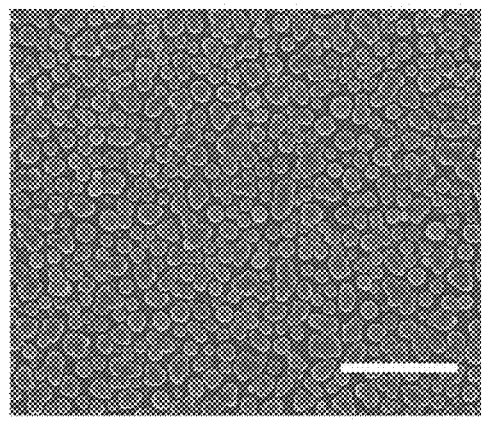

We now turn to examining the parameters that govern the average size and the particle-to-glass coverage values associated with the formation of arrays of hollow silica half-nanospheres on PTCS-modified glass. The SEM images in FIGS. 6A, 10A and 10B compare the patterns of silica half-nanospheres obtained from various PTCS-modified glass substrates produced at 30° C., 60° C. and 90° C., respectively. Given that the size and density of PTCS aggregates distributed on glass substrates depend upon the deposition temperature (see FIGS. 4A-D), each substrate yields a different pattern of silica half-nanospheres under fixed conditions of TEOS hydrolysis (3 h, 20% w/v ammonium hydroxide solution, room temperature, under ca. 100 Torr), and it can be observed that patterns of increasingly large PTCS aggregates tend to yield arrays of increasingly large half-nanospheres. In parallel, the particle-to-glass coverage increases as follows: ca. 26% on PTCS-modified glass produced at 30° C. (FIG. 6A), ca. 41.2% (mean surface area of ca. 0.026 $\mu m^2$) on PTCS-modified glass produced at 60° C. (FIG. 10A), and ca. 63.2% (mean surface area of ca. 0.133 $\mu m^2$) on PTCS-modified glass produced at 90° C. (FIG. 10B). In a parallel attempt to control the size of the silica half-nanospheres by changing the TEOS hydrolysis conditions under set PTCS-modified substrate parameters (1 h, 30° C., under ca. 130 Torr), we examined the effect of partial pressure in the ammonia precursor in the vapor phase by diluting the concentration of the aqueous ammonium hydroxide solution to only 2.5% w/v (here, we note that a longer TEOS hydrolysis time of 6 h is required to achieve nanostructures that are sufficiently thick to maintain their integrity during the chamber evacuation process, see FIGS. 5A and 5D). Comparing the SEM images in FIGS. 6A and 6B reveals that larger-sized silica half-nanospheres can be produced from the diluted ammonium precursor solution—an experimental result that emphasizes the importance of reaching a critical concentration of ammonia at the water droplet/air interface in order to effectively catalyze the TEOS hydrolysis step and immobilize individual water droplets in thin shells of $SiO_2$ at the early stages of condensation. Importantly, this alternative approach provides another means of controlling the size of the silica half-nanospheres independently of the substrate parameters. The SEM images in FIGS. 6B, 10C, 10D and 6C compare the patterns of silica half-nanospheres obtained from various PTCS-modified glass substrates produced at 30° C., 60° C., 90° C., and 120° C., respectively, and with a lower partial pressure in the ammonia precursor (diluted ammonium hydroxide solution: 2.5% w/v) during the TEOS hydrolysis step. Here again, each substrate yields a different pattern of silica half-nanospheres under the fixed conditions of TEOS hydrolysis (6 h, 2.5% w/v ammonium hydroxide solution, room temperature, under ca. 100 Torr), and it can be observed that patterns of increasingly large PTCS aggregates tend to yield arrays of increasingly large half-nanospheres. In parallel, the particle-to-glass coverage increases as follows: ca. 27.3% on PTCS-modified glass produced at 30° C. (FIG. 6B), ca. 57.4% (mean surface area of ca. 0.063 µm$^2$) on PTCS-modified glass produced at 60° C. (FIG. 10C), ca. 63.6% (mean surface area of ca. 0.222 µm$^2$) on PTCS-modified glass produced at 90° C. (FIG. 10D), and ca. 61.4% (mean surface area of ca. 0.481 µm$^2$) on PTCS-modified glass produced at 120° C. (FIG. 6C).

The UV-Vis-NIR transmittance spectra shown in FIG. 6D indicates that the arrays of hollow silica half-nanospheres obtained from various PTCS-modified glass substrates affect the optical absorption of glass to a negligible extent. The minimal optical footprint of the nanostructured patterns can be explained on the basis of the thinness of the SiO$_2$ thin shells (20-30 nm) formed concurrently around the water droplets during the BF process. It is worth noting, however, that larger hollow silica half-nanospheres induce a slight decrease in the 300-600 nm wavelength range, likely due to enhanced Mie scattering as the size characteristics of the nanostructured pattern approach the wavelength of visible light. The excellent optical transmittance of the nanostructured glass substrates suggests that the arrays of hollow silica half-nanospheres obtained via the BF approach will be amenable to a wide range of applications for which surface engineering and light management strategies are important parameters, including optoelectronic and photonic thin-film devices and light-harvesting modules. Considering large-scale applications, we also note that the patterns of silica half-nanospheres described throughout this work have been found to be continuous, homogeneous and consistent between experiments. Our attempts to produce the same arrays on larger glass substrates (7.5 cm×3 cm, scale limited only by the dimensions of the CVD chamber) have shown the same level of consistency.

Finally, to demonstrate that this approach to nanostructuring surfaces with hollow half-nanospheres can be applicable to a broader range of surfaces, including highly nanostructured substrates, we produced BF-templated arrays of hollow silica half-nanospheres on a superhydrophobic surface composed of ZnO nanorods. The SEM images in FIG. 7 show the perfluorodecyltriethoxysilane (PTES)-modified ZnO nanorod arrays[35] onto which a pattern of hollow silica half-nanospheres has been induced. The SEM cross-section in the inset of FIG. 7 confirms that the apparent silica "nanodomes" formed on PTES-modified ZnO nanorods are hollow, as expected from our prior observations of arrays of hollow silica half-nanospheres formed on various PTCS-modified glass substrates. Here, we note that it was not necessary to modify the PTES-functionalized ZnO nanorod arrays further with PTCS aggregates, because of the highly nanostructured and hydrophobic nature of the substrate used, promoting the BF process.

Conclusion

In summary, we have shown how arrays of hollow silica half-nanospheres can be produced on various substrates via the BF approach. In our approach, forming the hollow nanostructured assemblies on glass substrates requires that the glass be modified with PTCS aggregates evenly distributed across the glass surface, and we discussed how PTCS aggregate size and density as well as aggregate-to-glass coverage influence the development of the BF-templated arrays of hollow silica half-nanospheres, including the size of the half-nanospheres. As the hollow nanostructured assemblies are produced in a concurrent BF process and hydrolysis step under a saturated atmosphere of TEOS precursor and ammonia vapors, the size of the half-nanospheres also depends on the local concentration of ammonia at the water droplet/air interface. A critical local concentration of ammonia is important to catalyze the TEOS hydrolysis step and immobilize individual water droplets in thin shells of silica at the early stages of condensation. Importantly, this second approach provides another means of controlling the size of the silica half-nanospheres independently of the substrate parameters.

Arrays of hollow silica half-nanospheres obtained via the BF approach may be amenable to a wide range of applications for which surface engineering and light management strategies are important parameters, such as optoelectronics, photonic devices and light-harvesting modules. In parallel, we note that condensation processes are of fundamental interest, and that among all of the techniques known to date, our experimental protocol may provide a powerful tool for the ex-situ analyses of condensation in the very early stages. Future work will emphasize approaches that can improve the uniformity and periodicity of the hollow nanostructured assemblies on various surfaces and will examine the possibility to form arrays of half-nanospheres with functional metal oxides amenable to charge storage and solar energy conversion processes.

EXPERIMENTAL

Preparation of the Substrates and Nanostructured Arrays
Materials:

Zinc nitrate hexahydrate ($Zn(NO_3)_2 \cdot 6H_2O$, 98%) was purchased from Fisher Chemicals. Hexamethylenetetramine (($CH_2)_6N_4$, 99%) and ammonium hydroxide ($NH_4OH$, 20% in water) were purchased from Acros. Acetone, isopropanol, chloroform, chlorobenzene, 1-chloronaphthalene, tetraethyl orthosilicate (TEOS) ($Si(OC_2H_5)_4$, 98%), 1H,1H,2H,2H-Perfluorooctyltriethoxysilane (PTES) (98%), and 1H,1H,2H,2H-Perfluorododecyltrichlorosilane (PTCS) (97%) were purchased from Aldrich. Extran 300 detergent was purchased from EMD. All of the chemicals were used as received without further purification, unless otherwise mentioned. Milli-Q water (DI water) with a resistivity >18.0 MΩ·cm was used throughout the substrate cleaning steps. The glass slides were purchased from VWR (Vistavision™), the fused silica slides were purchased from Antek Optics, and the silicon wafers were purchased from Luva system. Inc.

Substrate Cleaning and Hydration/Dehydration Pre-Treatments:

All bare glass slides were examined via short-wavelength UV light in order to differentiate between the "air-side" surface and the "tin-side" surface (inherent to the glass-making process), and the "air-side" surface was systematically used in all experiments. The glass slides, and the fused silica and silicon (with thermal oxidized layers of ca. 200 nm) substrates were thoroughly scrubbed with a diluted solution of Extran 300 detergent, and were then immersed in a sonication bath of diluted Extran 300 for 20 min (Branson 5510) to remove all organic residues. Next, the substrates were rinsed under flowing deionized water for 5 min and sonicated for 20 min in acetone and isopropanol baths. The substrates were immersed in isopropanol and left in the solvent for no more than two days before use. All of the substrates were dried under nitrogen flow before use. Hydration of the glass slides was carried out by i) immersing of the substrates in DI water, and ii) heating the substrates immersed in DI water to 85° C. for a period of 24 h. Dehydration of the glass slides was carried out by heating the substrates at 500° C. for a period of 3 h (under atmospheric conditions).

PTCS Vapor Deposition Step:

The vapor deposition of PTCS was carried out in a deposition chamber placed under inert atmosphere in a glovebox filled with nitrogen ($H_2O<0.1$ ppm) in order to exclude the possibility that moisture affects the process. A deposition chamber equipped with a temperature-control stage, pressure-control valves and a flowmeter (chamber diameter: 15.3 cm, height: 7.6 cm) was used for the PTCS deposition step. The inside of the chamber was thoroughly cleaned with solvents between experiments. Before each deposition, the chamber was set under vacuum and preheated to the desired temperature for 2 h to remove any residual trace of moisture. Clean substrates with no pretreatment were placed in a closed petri dish and annealed at 120° C. for 2 h in air and were then transferred to the glovebox (within 1 min). Dehydrated glass substrates (500° C. for a period of 3 h in air) were taken out of the oven at ca. 120° C. and quickly transferred into the glovebox (within 1 min). The substrates were then placed on the heating stage of the deposition chamber inside the glovebox and left on the stage for ca. 3 min before the PTCS deposition step. Next, a vial filled with 200 µL of PTCS (Fisher Scientific, Product NO. 14-955-330, 20 mL) was placed in the center of the deposition chamber and the chamber was rapidly evacuated and set under reduced pressure (ca. 130 Torr reached in ca. 40 s, evacuation rate was controlled by flowmeter), thus initiating the deposition process. Upon reaching the desired PTCS deposition time, the chamber was slowly vented over ca. 4 min, and the substrates were taken out of the glovebox for the next deposition step.

TEOS Vapor Deposition Step:

The substrates were placed in a second deposition chamber (chamber diameter: 10 cm, height: 12 cm) on a stage between two vessels containing 1 mL of tetraethoxysilane (TEOS) and 1 mL of an aqueous solution of ammonium hydroxide (20% w/v, source of ammonia), respectively. The chamber was then slowly evacuated over ca. 3 min to reach a reduced pressure of ca. 100 Torr, and the pressure valve was closed and the substrates were exposed to the water, TEOS, and ammonia vapors for the desired TEOS hydrolysis time. Upon reaching the desired TEOS hydrolysis time, the pressure was reduced back to its initially set value in the chamber (ca. 100 Torr, for ca. 3 min) to remove the vapor contents from the chamber. The chamber was vented, and the substrates were taken out of the chamber. Note: A TEOS deposition time of 3 h was found necessary to form arrays of hollow silica half-nanospheres with a concentrated solution of ammonium hydroxide (20% w/v), while a TEOS deposition time of 6 h was found necessary to form arrays of hollow silica half-nanospheres with a diluted solution of ammonium hydroxide (2.5% w/v).

Preparation of the Superhydrophobic Array of PTES-Modified ZnO Nanorods:

A 5 nm seed layer of ZnO was sputtered on pre-cleaned glass slides (Equipment Support Co., Cambridge, England). Next, the substrates were suspended with the seed layer face down in a vessel filled with an aqueous solution of zinc nitrate hexahydrate (0.025 M) and hexamethylenetetramine (0.025 M) at 90° C. After 1 h, the substrates were removed from the hydrothermal bath and thoroughly rinsed under flowing DI water. The resulting ZnO-nanostructured substrates were placed at the center of a petri dish, and 2 mL of PTES in ethanol (1%, v/v) was drop-cast in places across the petri dish, around the substrate. 2 mL of water was also carefully drop-cast around the substrate so as to induce a moist atmosphere. The petri dish was then covered and the closed vessel was placed in an oven and heated to 140° C. for 1 h under atmospheric conditions. Finally, the ZnO-nanostructured substrates were carefully rinsed with acetone and further sonicated in acetone for 5 min to remove unreacted PTES precursors. The resulting superhydrophobic substrates showed static water contact angles of ca. 160°.

Optical and Imaging Characterizations

Equipment and Experimental Methods:

Optical transmittance measurements were performed with a Cary 6000i UV-Vis-NIR spectrophotometer under normal incidence. Atomic force microscopy (AFM) was performed with a Dimension Icon scanning probe microscope (BRUKER) in the tapping mode, and an antimony-doped Si cantilever with a spring constant of 42 N/m (TESPA, Veeco) was used for the analysis; the standard radius of the tip was 8 nm. Particle analysis of PTCS aggregates was carried out by processing the AFM images with the offline data processing software NanoScope Analysis from Bruker. Scanning electron microscopy (SEM) was performed with a FEI Nova Nano 630 equipped with a through-lens detector; the acceleration voltage was tuned to 1-5 kV, spot size: 0.5-1.5, working distance: 1-3 mm. In the cross-section SEM characterizations, Pt was sputtered on the sample to compress the charging effects (deposition time: 25 s; current intensity: 15 mA). Particle analysis including particle area distribution, average particle area, and particle-to-glass coverage was carried out by analyzing the SEM images with the Java-based image processing program ImangJ 1.47v (National Institutes of Health, USA). Transmission electron microscopy (TEM) characterization was carried out with a Titan CT operating at an accelerating voltage of 120 kV. TEM sample preparation: the hollow silica half-nanospheres were lifted off from the substrates and were dispersed in ethanol before being solution cast on the TEM grid (Cu-300CN, Grid-Tech).

REFERENCES

1. Widawski, G.; Rawiso, M.; Francois, B. Self-Organized Honeycomb Morphology of Star-Polymer Polystyrene Films. *Nature* 1994, 369, 387-389.
2. Kabuto, T.; Hashimoto, Y.; Karthaus, O. Thermally Stable and Solvent Resistant Mesoporous Honeycomb Films from a Crosslinkable Polymer. *Adv. Funct. Mater.* 2007, 17, 3569-3573.
3. Galeotti, F.; Andicsova, A.; Yunus, S.; Botta, C. Precise Surface Patterning of Silk Fibroin Films by Breath Figures. *Soft Matter* 2012, 8, 4815-4821.
4. Wan, L. S.; Li, J. W.; Ke, B. B.; Xu, Z. K. Ordered Microporous Membranes Templated by Breath Figures for Size-Selective Separation. *J. Am. Chem. Soc.* 2012, 134, 95-98.
5. Zhu, Y. D.; Sheng, R. L.; Luo, T.; Li, H.; Sun, J. J.; Chen, S. D.; Sun, W. Y.; Cao, A. Honeycomb-Structured Films by Multifunctional Amphiphilic Biodegradable Copolymers: Surface Morphology Control and Biomedical Application as Scaffolds for Cell Growth. *ACS Appl. Mater. Interfaces* 2011, 3, 2487-2495.
6. Stenzel, M. H.; Barner-Kowollik, C.; Davis, T. P. Formation of Honeycomb-Structured, Porous Films via Breath Figures with Different Polymer Architectures. *J. Polym. Sci. Pol. Chem* 2006, 44, 2363-2375.
7. Li, X. F.; Zhang, L. A.; Wang, Y. X.; Yang, X. L.; Zhao, N.; Zhang, X. L.; Xu, J. A. A Bottom-Up Approach To Fabricate Patterned Surfaces with Asymmetrical $TiO_2$ Microparticles Trapped in the Holes of Honeycomblike Polymer Film. *J. Am. Chem. Soc.* 2011, 133, 3736-3739.

8. Kon, K.; Brauer, C. N.; Hidaka, K.; Lohmannsroben, H. G.; Karthaus, O. Preparation of Patterned Zinc Oxide Films by Breath Figure Templating. *Langmuir* 2010, 26, 12173-12176.
9. Boker, A.; Lin, Y.; Chiapperini, K.; Horowitz, R.; Thompson, M.; Carreon, V.; Xu, T.; Abetz, C.; Skaff, H.; Dinsmore, A. D.; Emrick, T.; Russell, T. P. Hierarchical Nanoparticle Assemblies Formed by Decorating Breath Figures. *Nat. Mater.* 2004, 3, 302-306.
10. Connal, L. A.; Qiao, G. G. Preparation of Porous Poly(dimethylsiloxane)-Based Honeycomb Materials with Hierarchal Surface Features and Their Use as Soft-Lithography Templates. *Adv. Mater.* 2006, 18, 3024-3028.
11. Bunz, U. H. F. Breath Figures as a Dynamic Templating Method for Polymers and Nanomaterials. *Adv. Mater.* 2006, 18, 973-989.
12. Park, J. S.; Lee, S. H.; Han, T. H.; Kim, S. O. Hierarchically Ordered Polymer Films by Templated Organization of Aqueous Droplets. *Adv. Funct. Mater.* 2007, 17, 2315-2320.
13. Yabu, H.; Shimomura, M. Simple Fabrication of Micro Lens Arrays. *Langmuir* 2005, 21, 1709-1711.
14. Yabu, H.; Shimomura, M. Single-Step Fabrication of Transparent Superhydrophobic Porous Polymer Films. *Chem. Mater.* 2005, 17, 5231-5234.
15. Yabu, H.; Takebayashi, M.; Tanaka, M.; Shimomura, M. Superhydrophobic and Lipophobic Properties of Self-Organized Honeycomb and Pincushion Structures. *Langmuir* 2005, 21, 3235-3237.
16. Brown, P. S.; Talbot, E. L.; Wood, T. J.; Bain, C. D.; Badyal, J. P. S. Superhydrophobic Hierarchical Honeycomb Surfaces. *Langmuir* 2012, 28, 13712-13719.
17. Hernandez-Guerrero, M.; Stenzel, M. H. Honeycomb Structured Polymer Films via Breath Figures. *Polymer Chemistry* 2012, 3, 563-577.
18. Bai, H.; Du, C.; Zhang, A. J.; Li, L. Breath Figure Arrays: Unconventional Fabrications, Functionalizations, and Applications. *Angew. Chem. Int. Edit.* 2013, 52, 12240-12255.
19. Dadgostar, S.; Tajabadi, F.; Taghavinia, N. Mesoporous Submicrometer $TiO_2$ Hollow Spheres As Scatterers in Dye-Sensitized Solar Cells. *ACS Appl. Mater. Interfaces* 2012, 4, 2964-2968.
20. Koo, H. J.; Kim, Y. J.; Lee, Y. H.; Lee, W. I.; Kim, K.; Park, N. G. Nano-embossed Hollow Spherical $TiO_2$ as Bifunctional Material for High-Efficiency Dye-Sensitized Solar Cells. *Adv. Mater.* 2008, 20, 195-199.
21. Li, H. X.; Bian, Z. F.; Zhu, J.; Zhang, D. Q.; Li, G. S.; Huo, Y. N.; Li, H.; Lu, Y. F. Mesoporous Titania Spheres with Tunable Chamber Stucture and Enhanced Photocatalytic Activity. *J. Am. Chem. Soc.* 2007, 129, 8406-8407.
22. Deng, X.; Mammen, L.; Zhao, Y. F.; Lellig, P.; Mullen, K.; Li, C.; Butt, H. J.; Vollmer, D. Transparent, Thermally Stable and Mechanically Robust Superhydrophobic Surfaces Made from Porous Silica Capsules. *Adv. Mater.* 2011, 23, 2962-2965.
23. Beysens, D.; Knobler, C. M. Growth of Breath Figures. *Phys. Rev. Lett.* 1986, 57, 1433-1436.
24. Balgar, T.; Bautista, R.; Hartmann, N.; Hasselbrink, E. An AFM Study of the Growth Kinetics of the Self-Assembled Octadecylsiloxane Monolayer on Oxidized Silicon. *Surf. Sci.* 2003, 532, 963-969.
25. Banga, R.; Yarwood, J.; Morgan, A. M.; Evans, B.; Kells, J. FTIR and AFM Studies of the Kinetics and Self-Assembly of Alkyltrichlorosilanes and (Perfluoroalkyl) trichlorosilanes onto Glass and Silicon. *Langmuir* 1995, 11, 4393-4399.
26. Bunker, B. C.; Carpick, R. W.; Assink, R. A.; Thomas, M. L.; Hankins, M. G.; Voigt, J. A.; Sipola, D.; de Boer, M. P.; Gulley, G. L. The Impact of Solution Agglomeration on the Deposition of Self-Assembled Monolayers. *Langmuir* 2000, 16, 7742-7751.
27. Jung, G. Y.; Li, Z. Y.; Wu, W.; Chen, Y.; Olynick, D. L.; Wang, S. Y.; Tong, W. M.; Williams, R. S. Vapor-Phase Self-Assembled Monolayer for Improved Mold Release in Nanoimprint Lithography. *Langmuir* 2005, 21, 1158-1161.
28. Hozumi, A.; Ushiyama, K.; Sugimura, H.; Takai, O. Fluoroalkylsilane Monolayers Formed by Chemical Vapor Surface Modification on Hydroxylated Oxide Surfaces. *Langmuir* 1999, 15, 7600-7604.
29. Legrange, J. D.; Markham, J. L.; Kurkjian, C. R. Effects of Surface Hydration on the Deposition of Silane Monolayers on Silica. *Langmuir* 1993, 9, 1749-1753.
30. Fritter, D.; Knobler, C. M.; Beysens, D. A. Experiments and Simulation of the Growth of Droplets on a Surface (Breath Figures). *Phys. Rev. A* 1991, 43, 2858-2869.
31. Gau, H.; Herminghaus, S. Ripening of Ordered Breath Figures. *Phys. Rev. Lett.* 2000, 84, 4156-4159.
32. Rykaczewski, K.; Chinn, J.; Walker, M. L.; Scott, J. H. J.; Chinn, A.; Jones, W. Dynamics of Nanoparticle Self-Assembly into Superhydrophobic Liquid Marbles during Water Condensation. *ACS Nano* 2011, 5, 9746-9754.
33. Rykaczewski, K.; Landin, T.; Walker, M. L.; Scott, J. H. J.; Varanasi, K. K. Direct Imaging of Complex Nano- to Microscale Interfaces Involving Solid, Liquid, and Gas Phases. *ACS Nano* 2012, 6, 9326-9334.
34. Rykaczewski, K.; Osborn, W. A.; Chinn, J.; Walker, M. L.; Scott, J. H. J.; Jones, W.; Hao, C. L.; Yao, S. H.; Wang, Z. K. How Nanorough is Rough Enough to Make a Surface Superhydrophobic During Water Condensation? *Soft Matter* 2012, 8, 8786-8794.
35. Gao, Y. Q.; Gereige, I.; El Labban, A.; Cha, D.; Isimjan, T. T.; Beaujuge, P. M. Highly Transparent and UV-Resistant Superhydrophobic $SiO_2$—Coated ZnO Nanorod Arrays. *ACS Appl. Mater. Interfaces* 2014, 6, 2219-2223.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

Many variations and modifications may be made to the above-described embodiments. All such modifications and variations are intended to be included herein within the scope of this disclosure and protected by the following claims.

We claim:

1. A method for forming a hollow metal oxide shell layer, comprising:
providing a substrate having a hydrophobic surface with a plurality of nucleation sites and a water vapor source, a catalyst vapor source, and a hydrolyzable metal oxide precursor vapor source in a closed chamber;

saturating the atmosphere of the closed chamber with the water vapor, the catalyst vapor and the hydrolyzable metal oxide precursor vapor;

condensing the water vapor at the nucleation sites on the surface of the substrate to form a plurality of water droplets;

hydrolyzing the hydrolyzable metal oxide precursor at an air-water interface of the water droplets in the presence of the catalyst vapor to immobilize each water droplet in a metal oxide shell; and removing the water to produce a substrate having a layer comprising a plurality of hollow metal oxide shells disposed on the hydrophobic surface.

2. The method of claim 1, wherein the hydrolyzable metal oxide precursor is a hydrolyzable silica precursor, hydrolyzable titanium oxide precursor, hydrolyzable zirconium oxide precursor, hydrolyzable tantalum oxide precursor, or a combination thereof.

3. The method of claim 1, wherein the plurality of nucleation sites comprises an array of organosilane aggregates.

4. The method of claim 3, wherein the organosilane is perfluorooctyltrichlorosilane (PTCS).

5. The method of claim 4, further comprising forming the organosilane aggregates by vapor-depositing the PTCS on the substrate at a temperature of 30° C., 60° C., 90° C., or 120° C.

6. The method of claim 2, wherein the hydrolyzable metal oxide precursor includes a hydrolyzable silica precursor is selected from the group consisting of tetrapropyl orthosilicate, silicon tetrachloride, and tetraethyl orthosilicate (TEOS).

7. The method of claim 1, wherein the water vapor source and catalyst vapor source is a first solution comprising an aqueous ammonium solution and the hydrolyzable metal oxide vapor source is a second solution comprising TEOS.

8. The method of claim 1, wherein the hydrophobic substrate is selected from the group consisting of glass, borosilicate glass, soda lime glass, hydrated glass, dehydrated glass, perfluorodecyltriethoxysilane-modified zinc-oxide nanorod arrays, silicon substrates with a thermally oxidized layer, and flexible plastics.

9. The method of claim 7, wherein the aqueous ammonia solution comprises 20% w/v ammonium hydroxide.

10. The method of claim 1, wherein the condensing and hydrolyzing occur concurrently.

11. The method of claim 4, wherein the PTCS aggregates have an average size within a range of 22.6±9.7 nm.

12. The method of claim 5, wherein the substrate is glass and the method further comprises preparing the substrate for vapor-deposition by dehydrating the glass.

13. The method of claim 7, wherein the metal oxide shells are 20-30 nm thick.

* * * * *